United States Patent [19]

Smith

[11] Patent Number: 5,635,821

[45] Date of Patent: Jun. 3, 1997

[54] LOW CELL CHARGE ENABLE CIRCUIT

[75] Inventor: Gregory J. Smith, Tucson, Ariz.

[73] Assignee: National Semiconductor Corporation, Santa Clara, Calif.

[21] Appl. No.: 497,575

[22] Filed: Jun. 30, 1995

[51] Int. Cl.[6] ............................................. H02J 7/00
[52] U.S. Cl. ......................... 320/40; 320/5; 320/49; 320/54; 320/15
[58] Field of Search ............................. 320/40, 49, 54, 320/5, 15

[56] References Cited

U.S. PATENT DOCUMENTS

| | | | |
|---|---|---|---|
| 4,792,743 | 12/1988 | Tsujino et al. | 320/15 |
| 4,931,738 | 6/1990 | MacIntyre et al. | 324/435 |
| 5,115,182 | 5/1992 | Ehmke et al. | 320/14 |
| 5,153,496 | 10/1992 | LaForge | 320/17 |
| 5,175,531 | 12/1992 | Whitmire et al. | 340/636 |
| 5,177,426 | 1/1993 | Nakanishi et al. | 320/13 |
| 5,206,578 | 4/1993 | Nor | 320/14 |
| 5,304,915 | 4/1994 | Sanpei et al. | 320/40 X |
| 5,477,130 | 12/1995 | Hashimoto et al. | 320/49 |
| 5,493,197 | 2/1996 | Eguchi et al. | 320/5 |
| 5,519,563 | 5/1996 | Higashima et al. | 320/40 X |
| 5,526,215 | 6/1996 | Higashima et al. | 361/86 |
| 5,530,336 | 6/1996 | Eguchi et al. | 320/40 X |
| 5,547,775 | 8/1996 | Eguchi et al. | 320/40 X |
| 5,554,919 | 9/1996 | Uchida | 320/5 X |
| 5,557,188 | 9/1996 | Piercey | 320/5 |

*Primary Examiner*—Peter S. Wong
*Assistant Examiner*—K. Shin
*Attorney, Agent, or Firm*—Skjerven, Morrill, MacPherson, Franklin & Friel

[57] ABSTRACT

A circuit and method of operating a circuit furnish a capability to connect a battery in a conduction mode to a battery pack and, therefore, to a charger. The circuit and method furnish this capability even when no power is available for driving normally active electronic circuits. The circuit includes passive-type components which sense for the presence of a charger and activate switches for connecting the battery to the charger. The circuit and method in these embodiments supply this capability by applying a voltage derived from the charger to a power switch connecting the battery to the battery pack. For example, for a battery pack utilizing a power switch including two power FETs connected back-to-back, the circuit pulls a gate potential of the power switch FETs as far as possible from the potential at the minus terminal of the power pack so that conduction through the FETs and battery accompanies attachment of the charger to the battery pack.

45 Claims, 9 Drawing Sheets

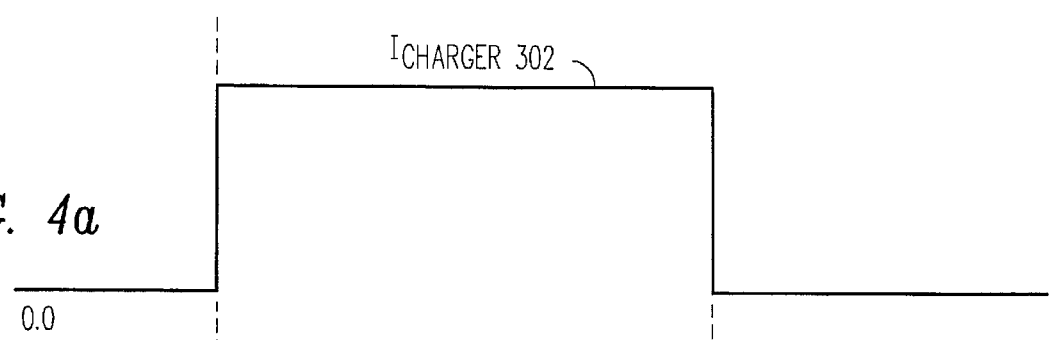
FIG. 4a
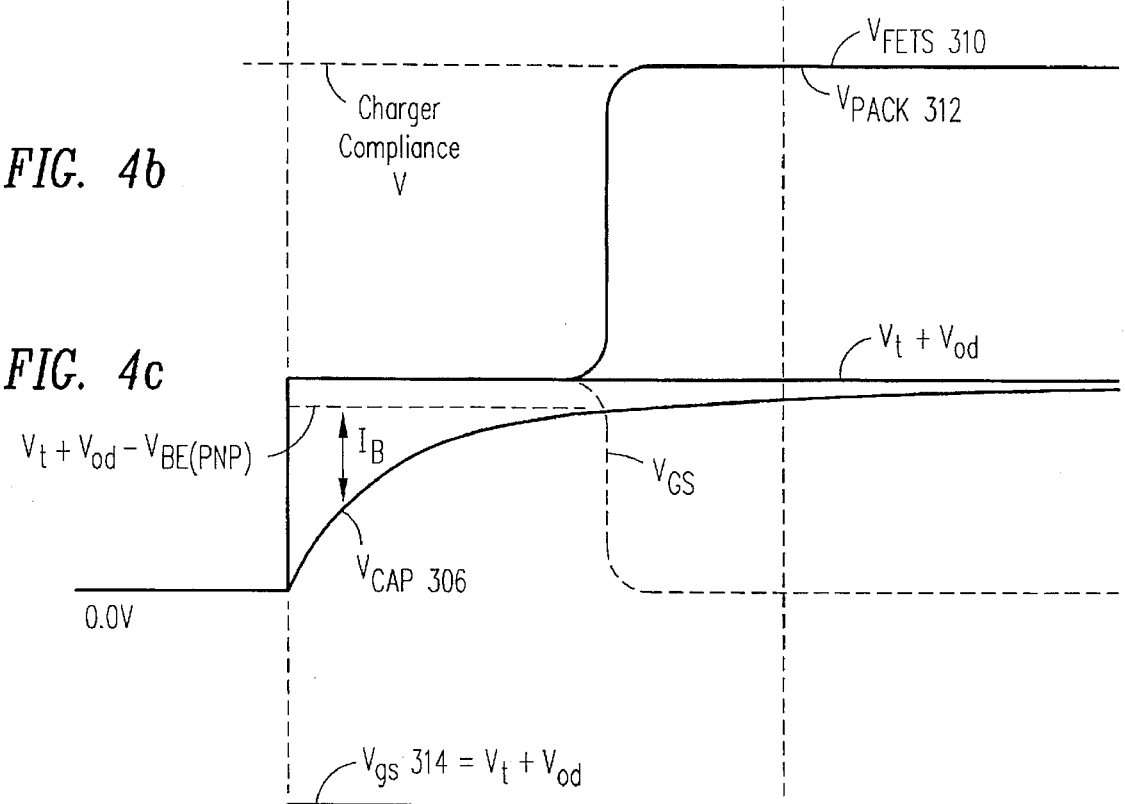
FIG. 4b
FIG. 4c
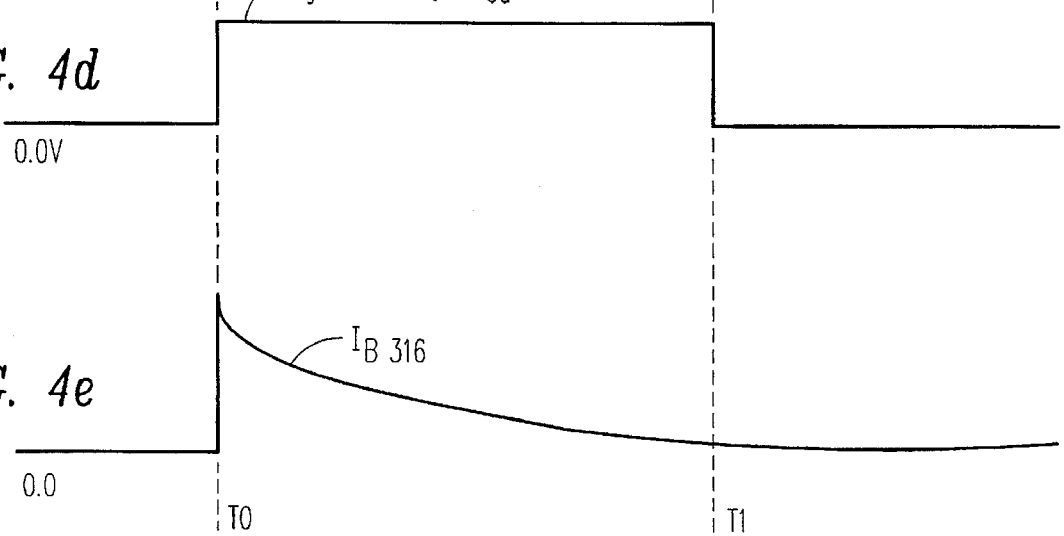
FIG. 4d
FIG. 4e

LOW CELL CHARGE ENABLE CIRCUIT

FIELD OF INVENTION

The present invention relates to the field of circuits for rechargeable battery packs. More specifically, this invention relates to circuits for monitoring and controlling charging and discharging of rechargeable batteries.

BACKGROUND OF THE INVENTION

Rechargeable battery packs often include a protection circuit for controlling charging and discharging of a battery. The protection circuit monitors various electrical conditions of the battery such as charge level and direction of current flow. In response to the monitored electrical conditions, the protection circuit controls various switches for connecting and disconnecting the battery cells from the battery pack terminals. For example, the protection circuit monitors to detect overcharge and overdischarge conditions and, upon detection of such conditions, the protection circuit controls a switch which disconnects the battery from an external charger or an external load.

Typically, the circuitry of the battery pack, including the protection circuit, is powered by the battery. Unfortunately, a condition may arise in which the battery becomes discharged to such a level that the voltage is insufficient to power the protection circuit. In this condition, the protection circuit can no longer operate the switches for connecting and disconnecting the battery from the pack. Conventional protection circuits generally have protective circuits inside the battery pack which utilize a power switch such as one or more high power field effect transistors (FETs) connected in series with the battery. If the battery voltage falls below the minimum voltage for sustaining circuit operations, the switches are permanently turned off so that the battery cells are unalterably disabled from connection to the battery pack terminals.

Previously, permanent disabling of the battery was considered a feature because the behavior of a deeply discharged battery was not known. The general perception of those in the industry was that the charging of a deeply discharged battery was likely to be dangerous. As the rechargeable battery industry has matured, it has become known that battery cells can be charged from a very low level, safely and successfully. Thus, otherwise perfect and operational rechargeable battery cells are now rendered useless due to permanent disablement by conventional protect circuits.

Thus, there is a need for a circuit which maintains a capability to charge a completely discharged battery cell.

However, one disadvantage of such a circuit is that a battery with a potential difference of zero volts across the terminals may not be completely discharged. Instead, the battery may be short-circuited. In such a case, the circuit for allowing charging of a discharged battery could potentially attempt to charge the battery indefinitely.

SUMMARY OF THE INVENTION

In accordance with the present invention, a circuit and method of operating a circuit furnish a capability to connect a battery in a conduction mode to a battery pack and, therefore, to a charger. The circuit and method furnish this capability even when no power is available for driving normally active electronic circuits.

In some embodiments, the circuit includes components which function even when power from the cell is unavailable to sense for the presence of a charger and activate switches for connecting the battery to the charger. The circuit and method in these embodiments supply this capability by applying a voltage derived from the charger to a power switch connecting the battery to the battery pack. For example, for a battery pack utilizing a power switch including two power FETs connected back-to-back, the circuit pulls a gate potential of the power switch FETs as far as possible from the potential at the minus terminal of the power pack so that conduction through the FETs and battery accompanies attachment of the charger to the battery pack.

In accordance with a first embodiment of the invention, a circuit for charging a deeply discharged battery cell includes two power FETs connected back-to-back in series at a common source node and a common gate node, a resistor connected between the common source node and the common gate node and plus and minus battery pack terminals for connection to a charger. The circuit also includes a transistor having a current path connected between the plus terminal and a ground reference and having a control terminal connected to the minus terminal and a resistor connected between the transistor control terminal and the minus terminal.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIG. 4a–e are a timing diagram which describes the operation of the low cell charge enable circuit shown in FIG. 2 as it acts upon a short-circuited battery cell.

DETAILED DESCRIPTION

Figure 1:
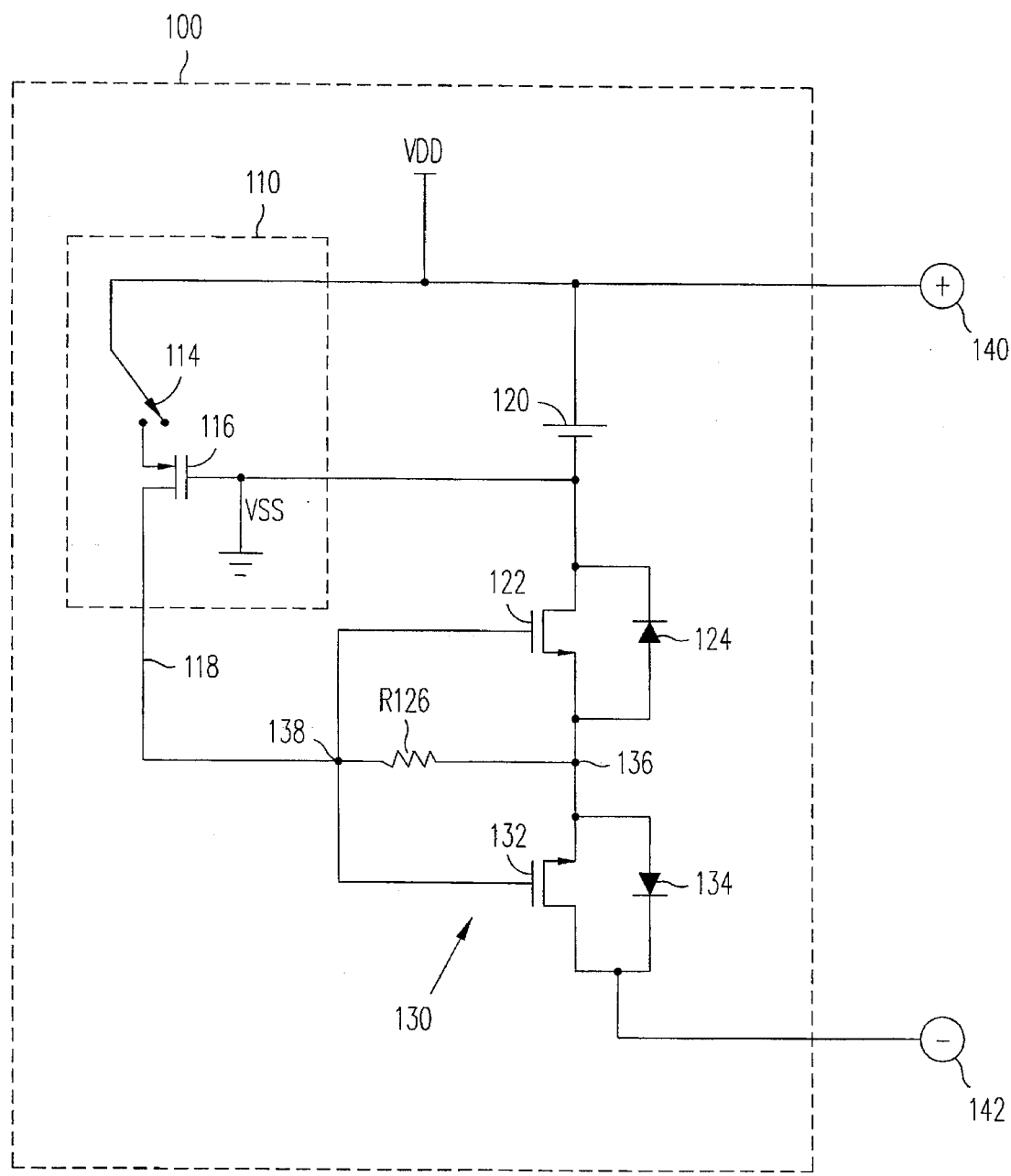
FIG. 1 is a schematic diagram illustrating mixed circuit and block structures of a battery pack.

Referring to FIG. 1, a battery pack 100 includes a battery 120, a controller 110 and a power switch 130. A plus terminal 140 and a minus terminal 142 supply an interface for connecting a battery charger (not shown).

In some embodiments, the battery is a single cell 120. In other embodiments, the battery takes the form of multiple parallel or series-connected cells 120. The battery is connected between a supply terminal VDD and a ground reference terminal VSS. The supply terminal VDD is connected to the plus terminal 140 of the battery pack 100.

The controller 110 controls charging of the cell 120 and generates signals for protecting from over-charging and over-discharging of a battery which includes a single battery cell 120 or multiple battery cells in a battery stack (not shown). The controller 110 controls battery measurements and, from these measurements, determines the polarity of the current entering the battery during charging or exiting the battery upon application of a load. The controller 110 also determines the condition of charge of the battery, whether the battery is overcharged or over-discharged. The controller 110 also determines the condition of charging of the battery by sensing the voltage across a shunt resistor (not shown) or the FETs to determine whether the current charging the battery is too large. If the cell 120 is overcharged or over-discharged, or if the charging current is too great, the controller 110 disconnects the cell 120 by applying a control signal to power MOSFETs 122 and 132 of the power switch 130. The controller 110 controls the ON/OFF state of the power switch 130, which is connected in series with the cell 120. The controller 110 includes a power source (supply terminal VDD), a switch 114 and a P-channel MOSFET 116. The switch 114 controls application of current from the power source to the source of P-channel MOSFET 116. The P-channel MOSFET 116 is a high voltage P-channel device having a drain which is connected to a control terminal 118 which is further connected to the power switch 130. The gate of MOSFET 116 is connected to the ground reference terminal VSS. The drain of MOSFET 116, a high voltage PMOS device, can be pulled far below the substrate potential so that, if an unsuitable charger is connected to the battery pack 100, the PMOS transistor 116 can withstand a large applied voltage.

The power switch 130 is connected in series with the cell 120 to effect disconnection and conduction of the cell 120. The power switch 130 protects the cell 120 from inadvertent electrical over-stress and safely controls charging of the cell 120. The power switch 130 includes two power N-channel MOSFETs 122 and 132 which are connected back-to-back in series with the sources of MOSFETs 122 and 132 connected at a common source node 136 and the gates of MOSFETs 122 and 132 connected at a common gate node 138. The power N-channel MOSFETs 122 and 132 are used to disconnect the cell 120 and place the cell 120 in a conduction state. When the back-to-back connected MOSFETs 122 and 132 are deactivated or turned off, the MOSFETs 122 and 132 advantageously block conduction of current in either direction. The power switch 130 also includes a resistor R 126 which is connected between the common source node 136 and the common gate node 138. The resistor is a relatively large resistor having a resistance in a range from approximately 0.5 MΩ to 1.5 MΩ, so that a 5 µA current creates a 5 volt signal which is sufficient to activate the MOSFETs 122 and 132. When no current is supplied to resistor R 126, MOSFETs 122 and 132 are turned off.

Two body-drain diodes 124 and 134 are formed across the source/drain pathways of the two power N-channel MOSFETs 122 and 132, respectively. The body-drain diodes 124 and 134 are conductive in a direction from source to drain of respective power N-channel MOSFETs 122 and 132. The drain of MOSFET 122 is connected to the ground reference terminal VSS. The drain of MOSFET 132 is connected to the minus terminal 142 of the battery pack 100. The common gate node 138 is connected to the control terminal 118 of the controller 110 to receive a control current for controlling the state of the power switch 130.

The power switch 130 elements, in combination, are implemented to achieve several objectives. In particular, the common-source and common-gate back-to-back interconnection of the power N-channel MOSFETs 122 and 132 completely blocks current in either direction to fully disconnect the cell 120. In addition, a current generated by the controller 110 is conducted through the resistor R 126, establishing a voltage across the gate-source terminals of the two power N-channel MOSFETs 122 and 132 and causing the MOSFETs 122 and 132 to become conductive, closing the power switch 130 and connecting the cell 120. When MOSFETS 122 and 132 are turned off, they remain off even when the source voltage VDD at plus terminal 142 supplied to the MOSFETs 122 and 132, in combination, is below the potential on the ground reference terminal VSS, even for voltage deficiencies in the range of ten volts or greater. The limit of the voltage deficiency tolerated by the battery pack 100 circuit is the breakdown voltage of MOSFET 116. The higher the breakdown voltage of MOSFET 116, the greater the magnitude of illegal charger voltages tolerated by the battery pack 100 circuit. This high voltage deficiency tolerance is advantageous in a protection circuit. For example, the disclosed protection circuit is specified to protect against illegal charge voltages from the supply terminal VDD to the control terminal 118 up to approximately 18 volts. Furthermore, these events occur although a P-type substrate layer of the controller 110 integrated circuit is at ground potential. The conditions of: (1) a VDD source voltage at plus terminal 142 of combined MOSFETs 122 and 132 that is substantially below the ground potential and (2) a ground potential of the controller 110 integrated circuit substrate, occur when a battery charger is connected to the battery pack 100 while the MOSFETs 122 and 132 are initially turned off (nonconducting). Accordingly, the controller 110 can turn on or off the power switch MOSFET transistors 122 and 132 of the battery pack 100 when the battery charger is connected and the MOSFETs 122 and 132 are to be activated or deactivated, respectively. During charging, MOSFET 132 functions in inverse active operation. When a load is connected to the battery pack 100, MOSFET 122 functions in inverse active operation.

The resistor R 126 also facilitates deactivation of the power N-channel MOSFETs 122 and 132 by reducing the voltage that is applied to the gates of the power N-channel MOSFETs 122 and 132. As current is conducted through the resistor R 126, the gate-source voltage $V_{gs}$ of the power N-channel MOSFETs 122 and 132 collapses, causing the MOSFETs 122 and 132 to turn off or deactivate. As the MOSFETs 122 and 132 are deactivated, the cell 120 is disconnected. Thus, the MOSFETs 122 and 132 are turned off when the cell 120 is disconnected so that no power is expended keeping the MOSFETs 122 and 132 inactive.

In the event of failure of a controller 110 integrated circuit, current is removed through the resistor R 126 and the power N-channel MOSFETs 122 and 132 are deactivated. In this manner, the battery pack 100 circuit fails safely.

Figure 2:
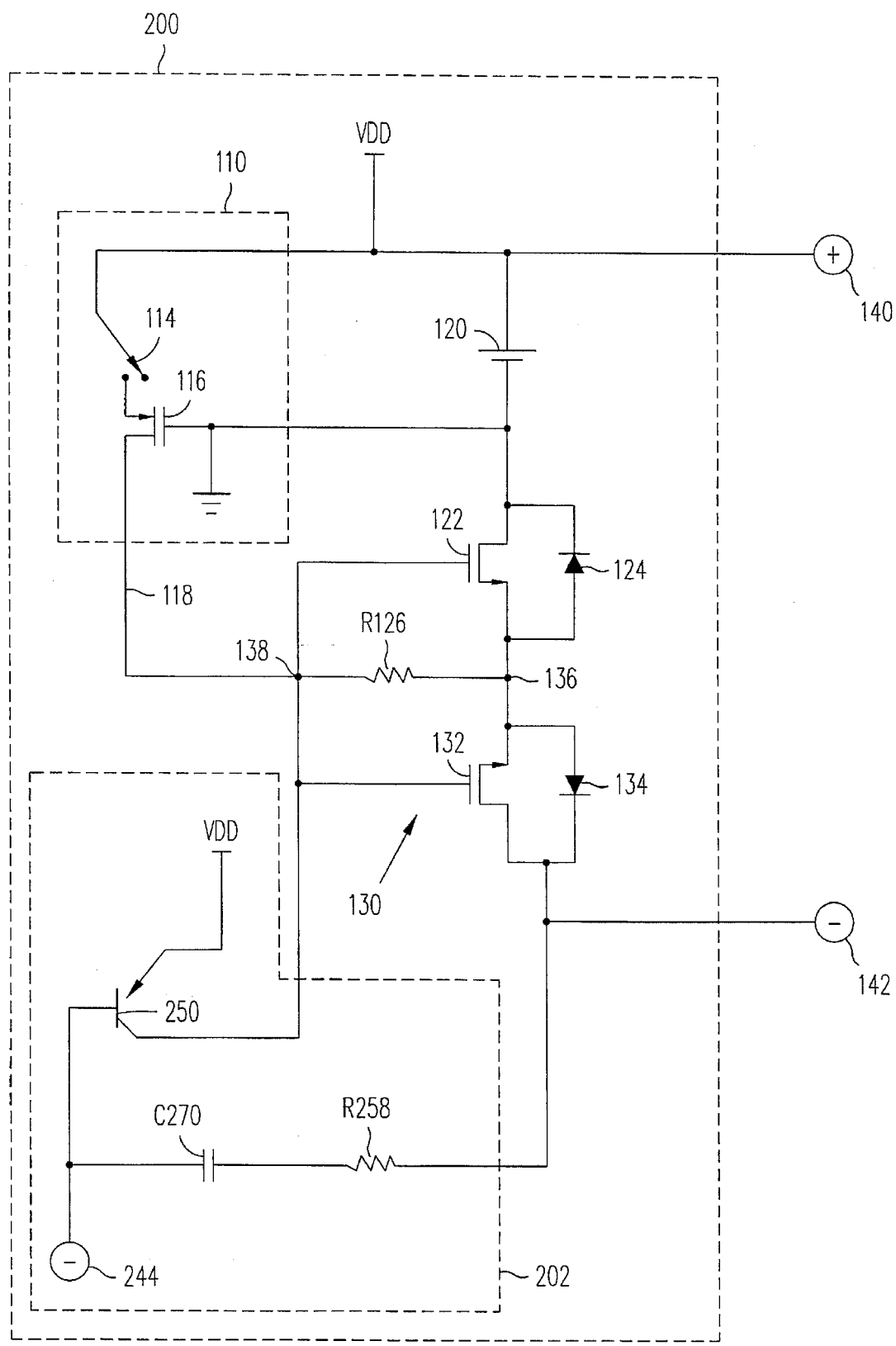
FIG. 2 is a schematic circuit diagram of a battery pack including a low cell charge enable circuit in accordance with a first embodiment of the present invention.

Referring to FIG. 2, one embodiment of a low cell charge enable circuit 202 is combined with the controller 110 and power switch 130 to form a battery pack 200 having a low charge enable capability. The low cell charge enable (LCCE)

circuit 202 includes a low cell charge enable (LCCE) transistor 250, a resistor R 258 and a capacitor C 270. The LCCE transistor 250 is a PNP transistor having an emitter connected to the plus terminal 140 of the battery pack 200, a collector connected to the common gate node 138 of the power switch 130, and a base connected to an LCCE minus terminal 244 which is tied to the battery pack minus terminal 142 through the resistor R 258 and the capacitor C 270. The LCCE circuit 202 furnishes a capability of charging a deeply discharged cell 120 as follows. When a charger (not shown) is applied to the plus 140 and minus 142 terminals of the battery pack 200, the negative potential at the minus terminal 142 pulls the base of the LCCE PNP transistor 250 negative. The base of the LCCE PNP transistor 250 is pulled negative immediately due to the inclusion of capacitor C 270 which is gradually charged after connection of the charger. The $V_{BE}$ threshold of the LCCE PNP transistor 250 is overcome, and the transistor 250 is turned on, pulling up the gates of the power N-channel MOSFETs 122 and 132 via the connection of LCCE PNP transistor 250 collector at the common gate node 138. The common gate node 138 is pulled up to within a PNP saturation voltage drop from the voltage at the plus terminal 140 of the battery pack 200. With the voltage at the common gate node 138 near the supply voltage VDD, the charger sources sufficient current to charge the cell 120 merely by pulling down the voltage on the minus terminal 142 to a positive magnitude across the battery terminals equal to combined threshold voltage $V_t$, the overdrive voltage $V_{overdrive\ FETs}$ of the N-channel MOSFETs 122 and 132 and the saturation voltage $V_{sat}$ of the LCCE PNP transistor 250, less the voltage across the cell (cell voltage $V_{CELL}$) The overdrive voltage $V_{overdrive\ FETs}$ is determined in accordance with the equation as follows:

$$V_{overdriveFETS} = \sqrt{\frac{2I_D L}{\mu C_{ox} W}}$$

wherein L and W are the gate length and gate width, respectively, $\mu$ is the carrier mobility of the FETs and $C_{ox}$ is the gate capacitance of MOSFETs 122 and 132. The voltage at the minus terminal 142 allows the compliance current of the charger to flow through the MOSFETs 122 and 132. The overdrive voltage $V_{overdrive\ FETs}$ is the gate overdrive voltage of the N-channel MOSFETs 122 and 132 that allows conduction of a charger current $I_{CHARGER}$.

Figure 3A:
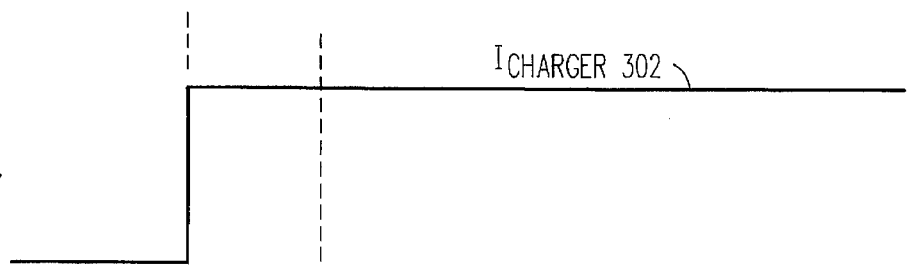
FIG. 3a–f are a timing diagram which describes the operation of the low cell charge enable circuit shown in FIG. 2.
Figure 3B:
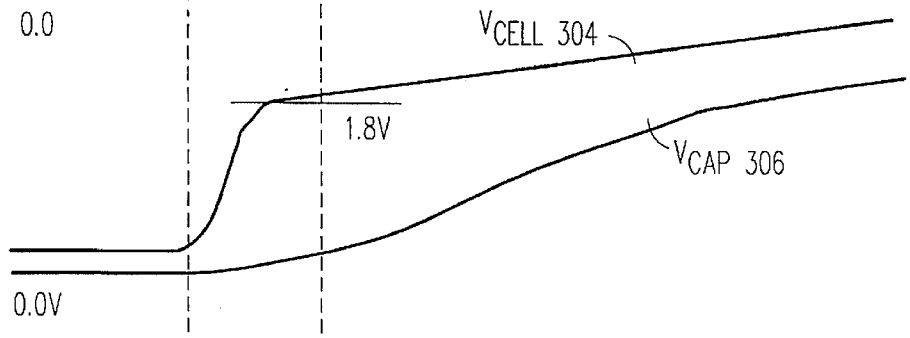
Figure 3C:
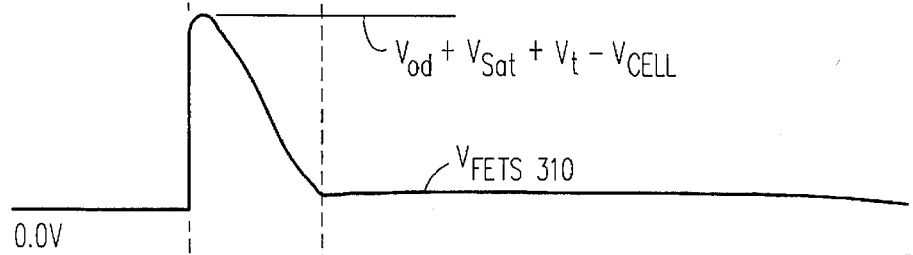
Figure 3D:
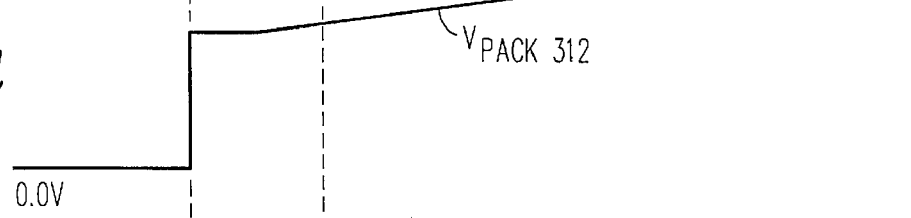
Figure 3E:
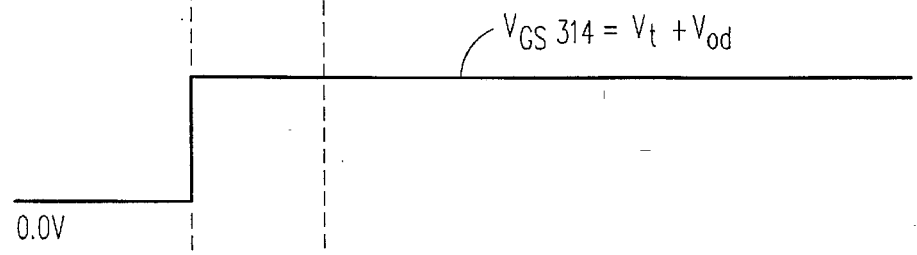

Referring to FIGS. 3a–f in conjunction with FIG. 2, a timing diagram shows the timing operation of the low cell charge enable circuit 202. FIG. 3a shows that the charger current $I_{CHARGER}$ 302 is applied to the battery pack 200 at time T0. Referring to FIG. 3b, a voltage $V_{CELL}$ 304 across the battery terminals from plus terminal 140 to the ground reference terminal VSS gradually rises after the charger is applied to the battery pack 200. Initially, the battery voltage $V_{CELL}$ 304 is very low. Similarly, a voltage $V_{CAP}$ 306 across the capacitor C 270 also starts low and gradually rises, typically lagging the rise in $V_{CELL}$ 304. FIG. 3c shows that a voltage $V_{FETS}$ 310 across the power switch 130 from the ground reference terminal VSS to the minus terminal 142 immediately jumps to the composite voltage $V_t$ plus $V_{overdrive\ FETs}$ of the N-channel MOSFETs 122 and 132, plus the saturation voltage $V_{sat}$ of LCCE PNP transistor 250 less $V_{CELL}$, then gradually falls as $V_{CELL}$ rises. Upon application of the charger, the voltage across the power N-channel MOSFETs 122 and 132 rapidly rises because the MOSFETs 122 and 132 are initially turned off. When the gate potential $V_{GATE-SOURCE}$ 314 is applied to the deactivated power N-channel MOSFETs 122 and 132, the MOSFETS 122 and 132 immediately begin conducting current, rapidly elevating the cell voltage $V_{CELL}$ 304. Very weakly charged rechargeable cells typically increase the cell voltage rapidly within the first few seconds of charging. As the cell voltage $V_{CELL}$ 304 rises, the voltage $V_{FETS}$ 310 decreases by the $V_{CELL}$ 304 magnitude. The applied charger voltage, which is less than a compliance voltage associated with the charger, is equal to a threshold voltage $V_t$ plus $V_{overdrive\ FETs}$ plus $V_{sat}$. Referring to FIG. 3d, a voltage $V_{PACK}$ 312 across the battery pack 200 from the plus terminal 140 to the minus terminal 142 is equal to the gate voltage $V_{GATE-SOURCE}$ 314 (FIG. 3e) of the N-channel MOSFETs 122 and 132 plus $V_{sat}$, the sum of which is also equal to the threshold voltage $V_t$ plus $V_{overdrive\ FETs}$ plus $V_{sat}$ immediately when the charger is connected at time T0. Upon connection of the charger, the voltage at the common gate node is pulled nearly all the way to the supply voltage $V_{DD}$ and the effective source voltages of the N-channel MOSFETs 122 and 132 at nodes 136 and 142 are pulled negative relative to the common gate node 138 so that the voltage across the power switch $V_{FETS}$ 310 decreases while the same gate source voltage $V_{GATE-SOURCE}$ 314 is maintained.

Figure 3F:
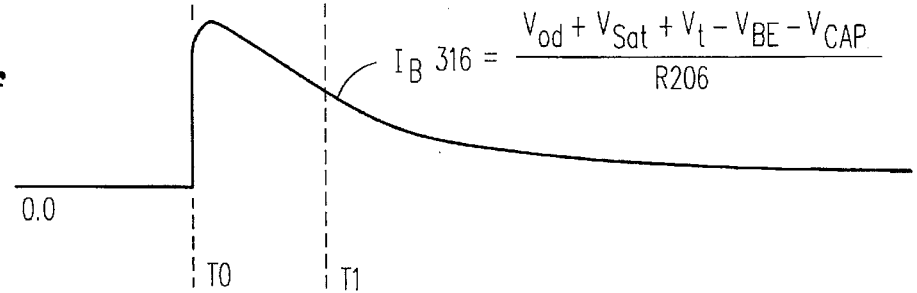

FIG. 3f shows that a base current $I_B$ 316 of the LCCE PNP transistor 250 jumps to a magnitude of $$((V_t+V_{overdrive\ FETs}-V_{CAP}+V_{sat}-V_{BE})/R),$$

where R is the resistance of resistor R 258 when the charger is applied and $V_{BE}$ is the base-emitter threshold of the LCCE PNP transistor 250. The base current $I_B$ 316 then gradually declines as voltage of the capacitor C 270 rises.

When the cell voltage $V_{CELL}$ 304 rises to a magnitude sufficient to power the controller 110 at time T1, the switch 114 is activated, thereby causing activation of the power switch 130 and maintaining the connection of the cell 120 to the charger. When the battery voltage $V_{CELL}$ 304 rises to a voltage, such as 1.8 volts, at which typical integrated circuit electronics become active, it is assumed that the cell voltage $V_{CELL}$ 304 is sufficient to elevate the gate potential $V_{GATE-SOURCE}$ 314 to a level that sustains triode operation of the MOSFETs. When the electronics become active, the supply $V_{DD}$ is switched by switch 114 to supply gate drive to the common gate node 138, thereby pulling up the gate voltage $V_{GATE-SOURCE}$ 314 to the $V_{DD}$ level or higher through a charge pumping operation. When the cell voltage $V_{CELL}$ 304 reaches the threshold for operating electronics, including the controller 110, the MOSFETs 122 and 132, which are low threshold transistors, become fully activated. When the MOSFETs 122 and 132 are fully activated the voltage $V_{FETS}$ 310 falls to a magnitude of essentially zero volts, specifically a voltage of approximately 50 to 100 mV (the charge current times the on-resistance of the MOSFETs). When the power switch 130 is activated, $V_{FETS}$ 310 falls essentially to zero volts, the gate voltage $V_{GATE-SOURCE}$ 314 escalates to $V_{DD}$ or higher if the voltage is pumped higher and the base current $I_B$ rapidly falls as $V_{CAP}$ increases. The voltage across the battery pack $V_{PACK}$ 312 is initially the threshold voltage $V_t$ plus $V_{overdrive\ FETs}$ plus $V_{sat}$ because this is the voltage necessary to keep the MOSFETs 122 and 132 activated. Once the cell voltage $V_{CELL}$ exceeds the combined voltages including threshold voltage $V_t$, overdrive voltage $V_{overdrive\ FETs}$ and saturation voltage $V_{sat}$, MOSFETs 122 and 132 are turned on hard and the battery pack voltage $V_{PACK}$ 312 gradually rises above the threshold voltage $V_t$ plus $V_{overdrive\ FETs}$.

During the interval from time T0 to time T1, when voltage $V_{FETS}$ 310 is large, the drain source voltage $V_{DS}$ and the drain current of N-channel MOSFETs 122 and 132 are both large so that much power is dissipated. Accordingly, this time interval is limited to endure for only a short time (for example, 0.5 to 2 seconds) until the cell voltage $V_{CELL}$ 304 rises to a suitable magnitude.

A typical magnitude for PNP base current $I_B$ 316 is about 1 μA. Immediately upon connecting the charger, the minus terminal 142 pulls down at the effective source (operating in inverse active mode) of N-channel MOSFET 132. The common gate node 138 is also pulled down, lagging the voltage at the minus terminal 142. The LCCE PNP transistor 250 goes into saturation, pulling the common gate node 138 positive while the charger pulls a node at the minus terminal 142 negative. The voltage across the battery pack, $V_{PACK}$ 312, reaches the gate threshold voltage $V_t$ plus some overdrive voltage across the gate source so that a current (for example, 1 Amp) is conducted through the power switch 130. The PNP base current $I_B$ decreases with time as the voltage across the capacitor C 270 increases. The resistance of resistor R 258 and capacitance of capacitor C 270 are chosen so that sufficient base current $I_B$ is maintained to keep the PNP transistor 250 in saturation for a time T1. The time duration T1 is relatively lengthy, on the order of seconds, so that the resistance and capacitance values are large.

The battery voltage $V_{CELL}$ 304 typically is raised above the threshold voltage $V_t$ of the N-channel MOSFETs 122 and 132 within a short time, on the order of a few seconds, activating the power switch 130 through activation of the controller 110 and connecting the cell 120 to the charger. A deeply discharged battery typically charges fairly rapidly and assumes normal chemical operation. Thus, the LCCE circuit 202 effectively provides for charging of a deeply discharged battery, essentially by conducting a current of about 1 Ampere for approximately a second. A zero volt battery is typically charged to a 1 or 2 volt range in a short 1 to 2 second period after application of a charger, before the charging plateaus and begins slowly increasing.

Referring to FIGS. 4a-e in conjunction with FIG. 2, a timing diagram shows the timing operation of the low cell charge enable circuit 202 as it acts upon a short-circuited battery cell. Because N-channel MOSFETs 122 and 132 dissipate a large amount of power, the capacitor C 270 furnishes a timing function to limit the amount of time the voltage at the common gate node 138 is held high. Otherwise, for a shorted cell 120, the N-channel MOSFETs 122 and 132 would continue to take power from the charger indefinitely. Thus, the RC circuit of resistor R 258 and capacitor C 270 furnishes a technique for timing out an interval during which the gate voltage of the power switch 130 is held up. Again, FIG. 4a shows the charger current $I_{CHARGER}$ 302 is applied to the battery pack 200 at time T0. If the cell 120 is short-circuited, the voltage across the battery terminals $V_{CELL}$ 304 remains at zero volts despite the application of the charger to the battery pack 200. However, FIG. 4c shows that the voltage $V_{CAP}$ 306 across the capacitor C 270 does gradually rise. Referring to FIG. 4b the voltage $V_{FETS}$ 310 across the power switch 130 immediately jumps to the threshold voltage $V_t$ plus $V_{overdrive\ FETs}$ of the N-channel MOSFETs 122 and 132 plus $V_{sat}$ of PNP transistor 250 and remains at that level since the cell voltage $V_{CELL}$ fails to rise. The voltage $V_{PACK}$ 312 across the battery pack 200 is essentially equal to the voltage $V_{FETS}$ 310 when the battery is short-circuited. Referring to FIG. 4d, the gate voltage $V_{GATE-SOURCE}$ 314 of the N-channel MOSFETs 122 and 132 escalates to the threshold voltage $V_t$ plus $V_{overdrive\ FETs}$ immediately when the charger is connected at time T0. FIG. 4e shows that the base current $I_B$ 316 of the LCCE PNP transistor 250 jumps to a magnitude of $(V_{overdrive\ FETs}+V_{sat}+V_t-V_{BE(PNP)}-V_{cap})/R$ where R is the resistance of resistor R 258 when the charger is applied. The base current $I_B$ 316 then gradually declines as $V_{cap}$ increases. The base current $I_B$ 316 continues to fall until the LCCE PNP transistor 250 can no longer sustain the gate drive to the power switch 130, disconnecting the power switch at time T1. In one embodiment of the LCCE circuit 202, the resistor R 258 has a resistance of 1 MΩ and the capacitor C 270 has a capacitance of 0.1 μf so that the resistor R 258 and the capacitor C 270 form an RC timing circuit that limits the gate drive of LCCE PNP transistor 250 to several seconds (for example, 4 to 8 seconds). Accordingly, the RC timing circuit determines a time constant which establishes that, if the battery voltage $V_{CELL}$ 304 is not raised to a reasonable magnitude within several time constants of the RC product, then charging is terminated by ending current flow through the N-channel MOSFETs 122 and 132. One time constant corresponds to a ⅔ change in battery voltage $V_{CELL}$ 304.

Figure 5:
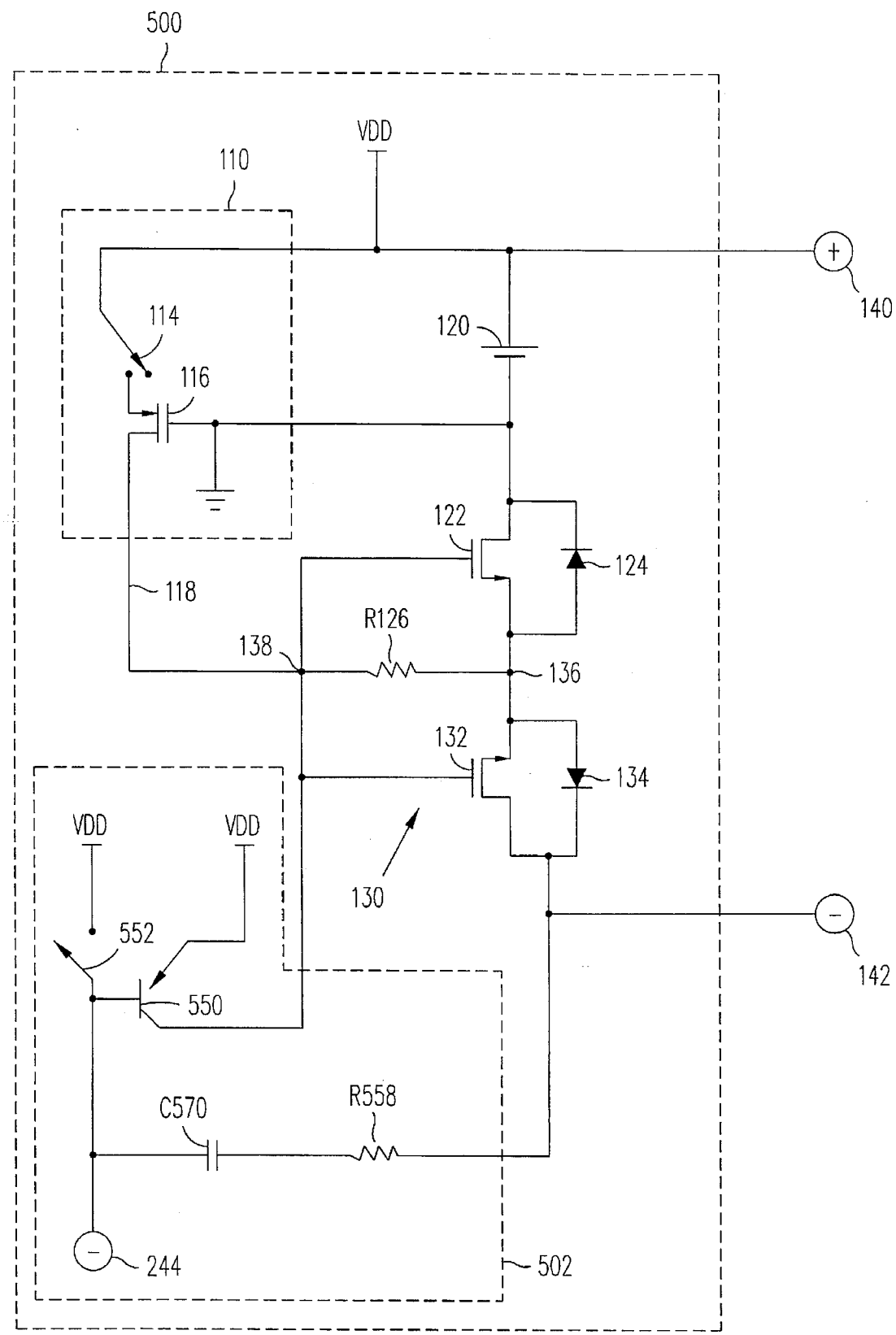
FIG. 5 is a schematic circuit diagram of a battery pack including a low cell charge enable circuit in accordance with a second embodiment of the present invention including a switch for controlling charging mode.

Referring to FIG. 5, another embodiment of a battery pack 500 includes a low cell charge enable (LCCE) circuit 502 having a switch 552 for disconnecting the LCCE circuit 502 from the battery pack 500. An LCCE switch 552 is included to disable the LCCE circuit 502 when the cell voltage $V_{CELL}$ is greater than about 1.8 V and is therefore sufficient to power the controller 110. Accordingly, the LCCE switch 552 blocks operation of the LCCE circuit 502 to charge the cell 120 when the cell 120 is capable of powering controller 110 or in an overcharged condition. The LCCE circuit 502 is combined with the controller 110 and power switch 130 to form a battery pack 500 having a low charge enable capability.

The low cell enable circuit 502 includes a first low cell charge enable transistor 550, a low cell charge enable (LCCE) switch 552, a resistor $R_{LCCE}$ 558, and a capacitor $C_{LCCE}$ 570. The LCCE circuit 502 includes a high voltage PNP transistor 550 having an emitter connected to a VDD power source terminal which is supplied by the plus terminal 140 of the battery pack 500. The collector of the high voltage PNP transistor 550 is connected to the gate of the N-channel MOSFETs 122 and 132 and is either conducting a turn-on current or is completely turned off. Advantageously, the LCCE circuit 502, by virtue of inclusion of high voltage PNP transistor 550, charges a zero-volt battery cell 120. Thus, the battery pack 500 includes two high voltage transistors, the MOSFET 116 and the PNP transistor 550, to pull up MOSFETs 122 and 132. MOSFET 116 is operative to pull up MOSFETs 122 and 132 when the controller 110 is powered by the cell 120 and therefore active. High voltage PNP transistor 550 is operative to pull up MOSFETs 122 and 132 when the cell voltage $V_{CELL}$ is low and the controller 110 is not powered.

Capacitor $C_{LCCE}$ 570 is connected in series with the resistor $R_{LCCE}$ 558 between the base of PNP transistor 550 and minus terminal 142. The capacitor $C_{LCCE}$ 570 and resistor $R_{LCCE}$ 558 form an RC circuit providing a timing function for preventing continued charging of a short-circuited battery.

The low cell charge enable switch (LCCE) 552 is included to enable the LCCE circuit 502 when the cell 120 is discharged to a weakened condition. The switch positions illustrated in FIG. 5, in which LCCE switch 552 disconnects the base of high voltage PNP transistor 550 from the VDD power source terminal, are appropriate for the low cell charge condition.

With the LCCE switch 552 in the illustrative position and the charger applied, the gate potential at the common gate node 138 is pulled up to the $V_{DD}-V_{sat}$ voltage level of high voltage PNP transistor 550. Accordingly, the LCCE circuit 502 is connected to the power switch 130 to provide for charging of a deeply discharged battery and is, therefore, operating in a low cell charge enable (LCCE) mode. The switch 552 is set by the controller 110 when the cell voltage $V_{CELL}$ falls below a preset minimum voltage.

Alternatively, when the cell voltage $V_{CELL}$ is greater than the preset minimum voltage, LCCE switch 552 is closed to disable current amplification of high voltage PNP transistor 550. Connected in this manner, the collector current of high voltage PNP transistor 550 is zero so that transistor 550 is bypassed, disconnecting the LCCE circuit 502 from the other circuits of the battery pack 500 and allowing the controller 110 and MOSFETs 122 and 132 to act as a protect circuit for protecting the cell 120.

When switch 552 is connected in the low cell charge enable (LCCE) mode, the low cell charge enable circuit 502 furnishes a capability to charge the cell 120 when the cell 120 is discharged below a minimum voltage, thereby supplementing the operation of the controller 110 as it functions to control the power switch 130 when controller 110 is not active due to a low $V_{DD}$ voltage. The power switch 130 is essentially a single series switch including the power N-channel MOSFETs 122 and 132. Operation of the power switch 130 is based on supplying sufficient voltage to the gate terminals of N-channel MOSFETs 122 and 132 relative to minus terminal 142 to allow the MOSFETs to conduct current.

For example, a cell 120 is discharged to zero volts. When a charger (not shown) is applied to the cell 120, the gate-source voltage $V_{GS}$ of the power N-channel MOSFETs 122 and 132 arises from the compliance voltage of the charger.

For a very small voltage across the cell 120, the power N-channel MOSFETs 122 and 132 are activated by pulling the effective source of the MOSFETs negative with respect to the gate voltage. This is done by the charger pulling the node at the minus terminal 142 down until current begins to conduct through the MOSFETs 122 and 132 and the cell 120. When a charger is applied to the deeply discharged cell 120, the potential at the common gate node 138 does not change appreciably. Therefore, for the MOSFETs 122 and 132 to be activated, the source terminal of power N-channel MOSFET 132 is pulled substantially negative. For example, for a MOSFET having a typical threshold of 1.5 volts and a battery that is discharged to zero volts, the drain to source voltage $V_{DS}$ necessary to conduct current through the MOSFET is approximately 1.5 V. Thus, the power dissipated in power N-channel MOSFETs 122 and 132 during activation of the MOSFETs to charge a deeply discharged cell 120 is quite high in comparison to the MOSFET power dissipation during normal operation. Until the cell 120 reaches a voltage sufficiently high to collapse the drain potential down toward the source potential, the power N-channel MOSFETs 122 and 132 dissipate extra power.

Figure 6:
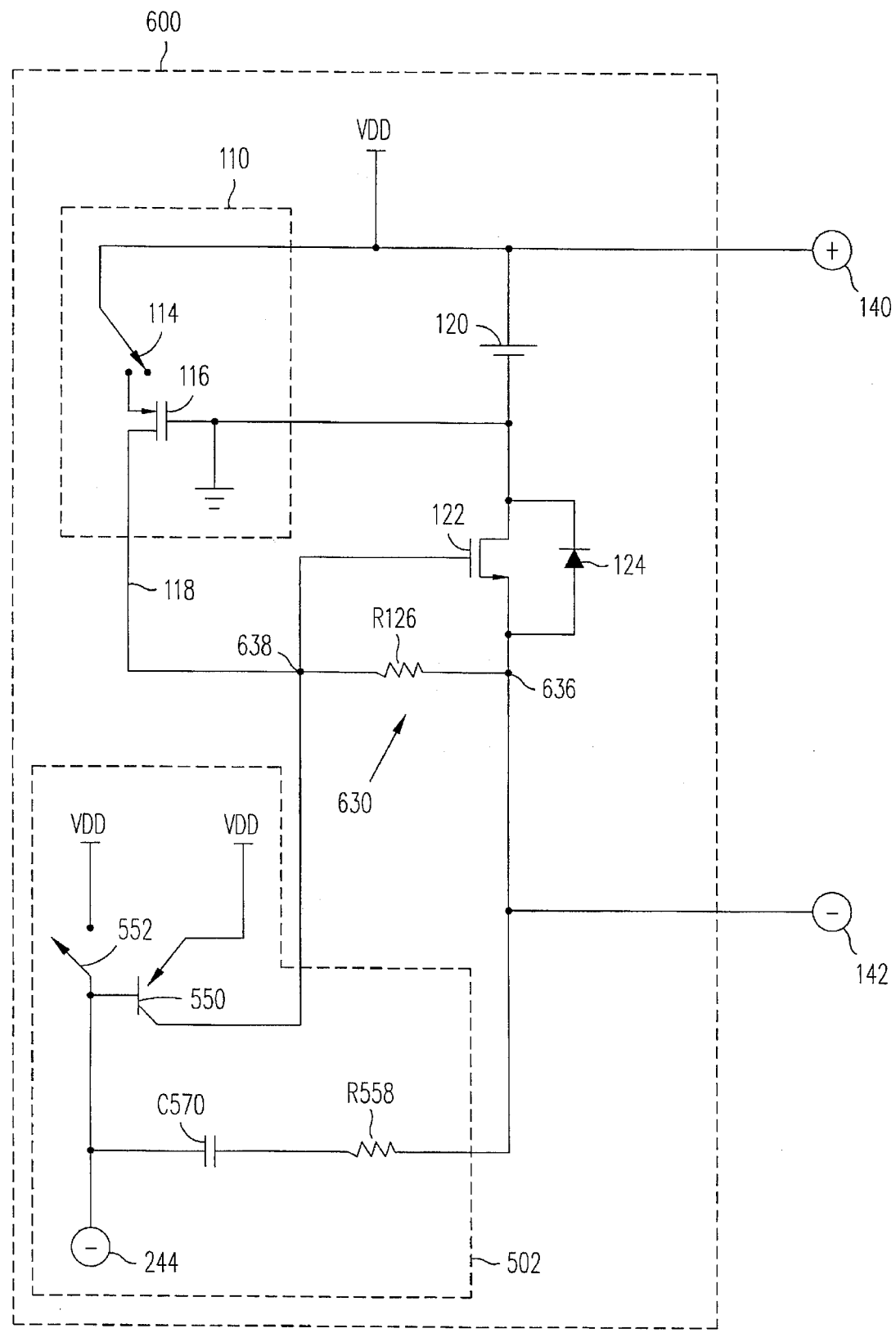
FIG. 6 is a schematic circuit diagram of a battery pack including a low cell charge enable circuit in accordance with a third embodiment of the present invention including an alternative power switch.

Referring to FIG. 6, an alternative embodiment of a battery pack 600 is shown which is similar to the battery pack 500 except that an alternative embodiment of a power switch 630 replaces power switch 130. The power switch 630 is connected in series with the cell 120 to disconnect and connect the cell 120. The power switch 630 includes one power N-channel MOSFET 122 and the resistor R 126 which is connected to the source of the N-channel MOSFET 122 at a node 636 and connected to the gate of the N-channel MOSFET 122 at a node 638. In another embodiment (not shown), a battery pack utilizes two N-channel MOSFETs as shown in the FIG. 5 power switch 130, however, the N-channel MOSFETs are drain-connected rather than source-connected. Drain-to-drain connected FETs require dual gate drive circuits and LCCE circuits because the gates are pulled toward their respective sources through separate resistors (for example, 1 MΩ each) or transistors so that both MOSFETs 122 and 132 can be turned off.

Figure 7:
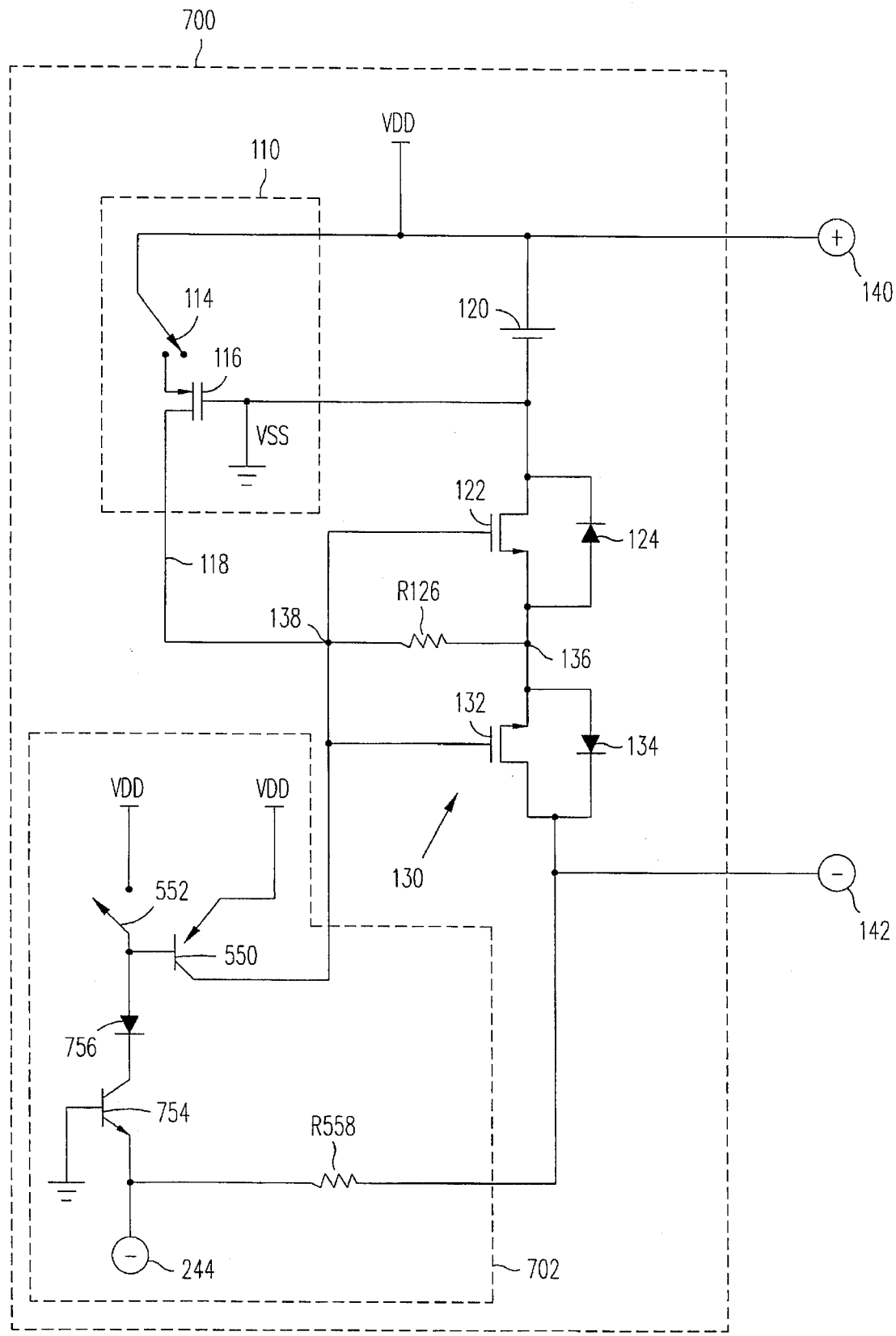
FIG. 7 is a schematic circuit diagram of a battery pack including a low cell charge enable circuit in accordance with a fourth embodiment of the present invention including an alternative low cell charge enable circuit.

Referring to FIG. 7, another embodiment of a battery pack 700 includes a low cell charge enable (LCCE) circuit 702 which is substantially the same as the LCCE circuit 502 but also includes an NPN transistor 754 and a diode 756 connected to allow current conduction from the VDD power source to the collector of NPN transistor 754 when switch 552 is closed. Because LCCE circuit 702 cannot charge a zero-volt cell 120, capacitor $C_{LCCE}$ 570 shown in FIG. 5, which prevents charging of a short-circuited cell, is not necessary and is, thus, not included in LCCE circuit 702. The LCCE circuit 702 includes an NPN transistor 754, which is typically not a high voltage transistor, having a base connected to the ground reference, a collector connected to the base of the high voltage PNP transistor 550 and an emitter connected to the LCCE minus terminal 244. The LCCE minus terminal 244 is connected to the minus terminal 142 of the battery pack 700 through a resistor $R_{LCCE}$ 558. LCCE switch 552 connects the base of high voltage PNP transistor 550 and the collector of NPN transistor 754 through diode 756 to the VDD power source terminal or allows NPN transistor 754 and high voltage PNP transistor 550 to actively gain current signals from resistor $R_{LCCE}$ 558.

Generally, when a battery is discharged to a weak state, it is disadvantageous for various components of the LCCE circuit, such as large volume capacitors, to impair the compact construction of a battery pack. To avoid usage of a capacitor, diode 756 is utilized to prevent charging of a short-circuited cell 120 in embodiments which do not include an RC timing timeout network. Diode 756 limits the LCCE circuit 702 to charge cells having a voltage greater than $V_{diode}$, a diode drop between the VDD power source voltage and ground. LCCE circuit 702 includes high voltage PNP transistor 550. NPN transistor 754 is used to curtail the base current of high voltage PNP transistor 550 when the cell voltage $V_{CELL}$ is less than the diode voltage $V_{diode}$.

The switches 114 and 552 are shown in LCCE mode, in which the voltage of the cell 120 is insufficient to power the controller 110. The switches 114 and 552 are switched simultaneously to the opposite state when the controller 110 is activated and the controller determines that the MOSFETs 122 and 132 should be on.

When a charger (not shown) is applied to the plus/minus terminals 140 and 142 of the battery pack 700, the minus terminal 142 is pulled low relative to the common gate node 138 which is pulled to VDD by the following method. The LCCE switch 552 at the base of high voltage PNP transistor 550 is open so that the NPN transistor 754 establishes a current flow through the resistor $R_{LCCE}$ 558 (for example, a 100 KΩ resistor). This current flow serves as a base drive to the high voltage PNP transistor 550 so that the current through the resistor $R_{LCCE}$ 558 is beta multiplied and applied to the common gate node 138, activating the power switch 130 and connecting the cell 120 to the charger.

Theoretically, the LCCE circuit 702 without diode 756 enables the charging of a cell 120 that is discharged to zero volts since the threshold of MOSFETs 122 and 132 allows the LCCE minus terminal 244 to be pulled down sufficiently for the NPN transistor 754 to turn on and conduct current. If the voltage of the cell 120 is actually zero volts so that the VDD power source terminal (connected to the top of the cell 120) is at zero volts and the base of the NPN transistor 754 is at a ground reference potential, the NPN transistor 754 is forced into hard saturation in which the collector is forced below the ground potential. Accordingly, the LCCE minus terminal 244 is forced below ground potential, allowing the PNP transistor 550 to turn on, albeit weakly. The activated PNP transistor 550 thus drives the common gate node 138 of the power switch 130 to a voltage very close (for example, within about 50 millivolts) to the voltage at the plus terminal 140 while the voltage supplied by the charger provides the voltage to actually activate the power switch 130. The presence of diode 756 limits the minimum chargeable cell voltage to $V_{diode}$.

The voltage on the LCCE minus terminal 244 does not fall lower than a diode drop below substrate ground potential. However, the voltage at the minus terminal 142 of the battery pack 500 can fall to a much lower potential. A voltage difference arising from a mismatch between the voltage on the LCCE minus terminal 244 and the battery pack minus terminal 142 is distributed across the resistor $R_{LCCE}$.

Figure 8:
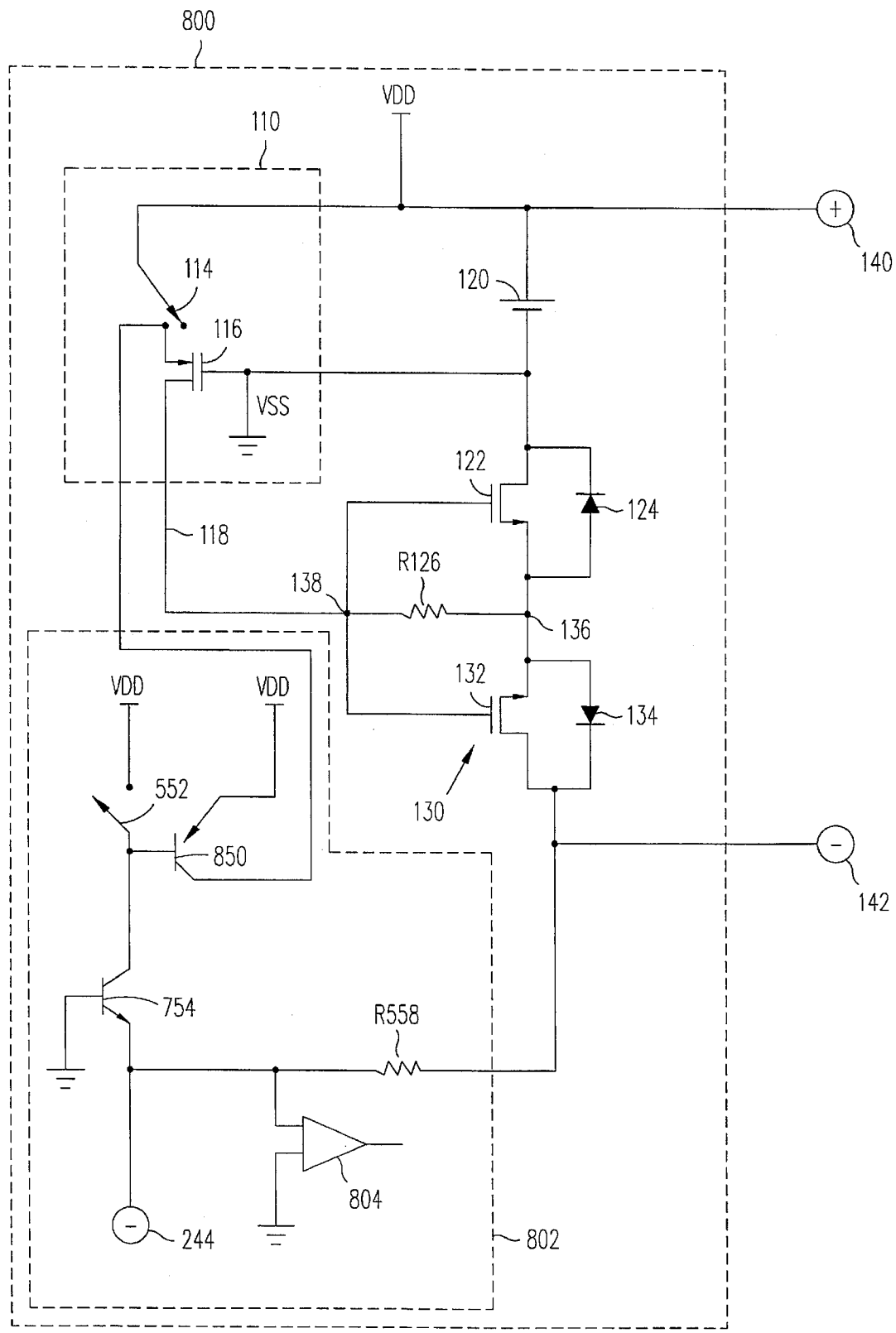
FIG. 8 is a schematic circuit diagram of a battery pack including a low cell charge enable circuit in accordance with a fifth embodiment of the present invention including an additional alternative low cell charge enable circuit.

One disadvantage of LCCE circuit 502 and LCCE circuit 702 shown in FIGS. 5 and 7, respectively, is that a high voltage PNP transistor 550 is utilized to pull up MOSFETs 122 and 132. Referring to FIG. 8, a further embodiment of a battery pack 800 includes a low cell charge enable (LCCE) circuit 802 substantially similar to the LCCE circuit 502 shown in FIG. 5 except the LCCE circuit 802 includes PNP transistor 850, which is not a high voltage transistor, to replace high voltage PNP transistor 550. Also, MOSFET 116 and PNP transistor 850 are connected as a cascode with the collector of PNP transistor 850 connected to the source, rather than the drain, of MOSFET 116. Accordingly, LCCE circuit 802 charges a low cell 120 by pulling up MOSFETs 122 and 132 through MOSFET 116, acting as a cascode. LCCE circuit 802, however, does include a comparator 804 for determining whether the voltage across the MOSFETs 122 and 132 is positive or negative relative to ground, ground being the potential between the MOSFETs 122 and 132 and the cell 120. Accordingly, the comparator 804 is used to determine whether a charger or a load is connected to the cell 120.

An advantage of LCCE circuit 802 is that a high voltage PNP transistor is not utilized. Thus, battery pack 800 only includes a single high voltage transistor—MOSFET 116. A disadvantage of LCCE circuit 802 in comparison to LCCE circuit 502 is that LCCE circuit 802 cannot charge a cell 120 charged to a voltage $V_{CELL}$ which is less than the gate-source voltage $V_{GS}$ of MOSFET 116, typically having a worst-case magnitude of 1.4 V to 1.5 V. Because LCCE circuit 802 cannot charge a zero-volt cell 120, capacitor $C_{LCCE}$ 570 shown in FIG. 5, which prevents charging of a short-circuited cell, is not necessary and is, thus, not included in LCCE circuit 802.

Note that in a CMOS process, optimized bipolar NPN and PNP transistors are not typically available. Accordingly, the NPN and PNP transistors shown in FIGS. 5, 6, 7 and 8 are alternatively replaced by parasitic transistors. Such an NPN transistor is, for example, a lateral Nwell to Nwell transistor having a base tied to the substrate. Such a PNP device is contained within an Nwell and its emitter and collector are P source diffusions. The NPN and PNP transistors are parasitic devices so that much of the current sourced from the resistor $R_{LCCE}$ 558 is lost to the substrate. Although current is lost at each bipolar junction transistor—NPN transistor 554 and PNP transistor 550, sufficient current drain exists at the PNP transistor 550 for common gate node 138 to be pulled high. The forced current gain of LCCE circuit 502, given by the ratio of the collector current of PNP transistor 550 to the emitter current of NPN transistor 554 and related to the ratio of resistances of resistor $R_{LCCE}$ 558 to resistor R 126, is sufficient to pull common gate node 138 high. For example, the ratio of resistances of resistor $R_{LCCE}$ 558 to resistor R 126 can be 1/10 while the current gain $I_{C850}/I_{E554}$ ranges from ten to one hundred. Thus, even though NPN transistor 754 loses current, sufficient current is restored through resistor $R_{LCCE}$ 558 by the gain of PNP transistor 850.

Figure 9:
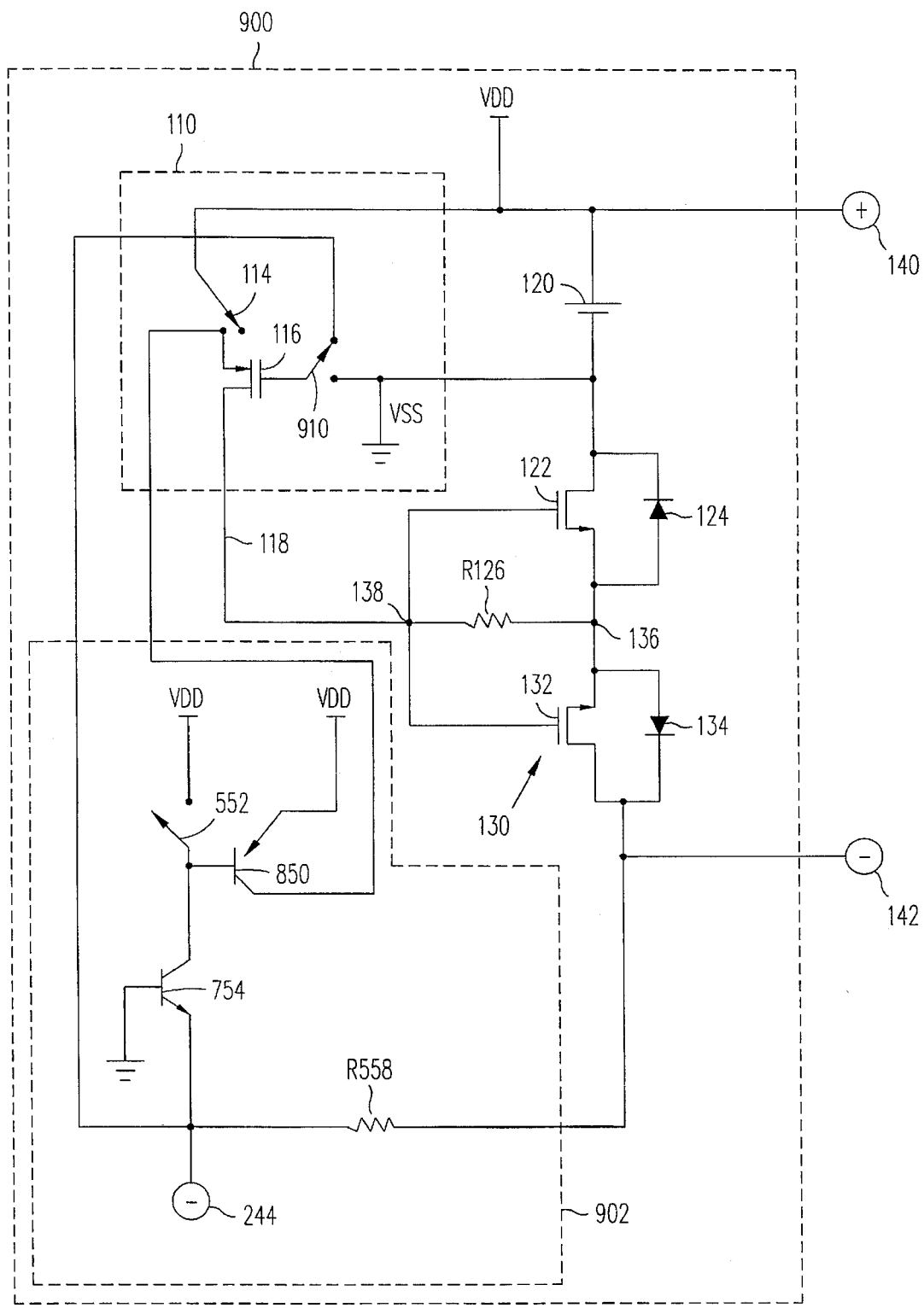
FIG. 9 is a schematic circuit diagram of a battery pack including a low cell charge enable circuit in accordance with a sixth embodiment of the present invention including an additional alternative low cell charge enable circuit.

The LCCE circuit 802 charges a cell 120 having a minimum voltage of 1.4 V to 1.5 V. However, it is advantageous to charge a cell 120 having a voltage of 0.5 V to 1 V. Referring to FIG. 9, a further embodiment of a battery pack 900 includes a low cell charge enable (LCCE) circuit 902 which is substantially similar to the LCCE circuit 802 shown in FIG. 8 except that the LCCE circuit 902 charges a lower voltage cell 120 by virtue of a different connection of the gate of MOSFET 116. In battery pack 900, a switch 910 is included at the gate of MOSFET 116 to alternatively connect the gate of MOSFET 116 to either the emitter of NPN transistor 554 or ground VSS. The switches 114, 552 and 910 are shown in LCCE mode, in which the voltage of the cell 120 is insufficient to power the controller 110. The switches 114, 552 and 910 are switched simultaneously to the opposite state when the controller 110 is activated.

Connected in this manner, LCCE 902 charges a cell 120 having a minimum voltage of $V_{GS116}-V_{BE554}$, the difference between the gate-source voltage of MOSFET 116 and the base-emitter voltage of NPN transistor 554. Accordingly, LCCE circuit 902 charges a cell 120 discharged to 0.5 V to 1 V, typically.

The illustration of LCCE circuit 902 does not show a comparator 804. Typically, a comparator 804 is included to determine whether a charger or a load is connected to the cell 120. Furthermore, some embodiments of LCCE circuit 902 include the diode 756 shown in FIG. 7 to limit an LCCE circuit to charge cells having a voltage greater than $V_{diode}$, a diode drop between the VDD power source voltage and ground.

The description of certain embodiments of this invention is intended to be illustrative and not limiting. Numerous other embodiments will be apparent to those skilled in the art, all of which are included within the broad scope of this invention. For example, the described embodiments of a low cell charge enable (LCCE) circuit utilize an integrated resistor and an integrated capacitor. In other embodiments, various combinations of integrated and external (off-chip) components, such as resistors and capacitors, may be used. In some embodiments, the capacitor is eliminated which is advantageous because capacitors are not easily formed in an integrated circuit.

What is claimed is:

1. A circuit for charging a deeply discharged battery cell comprising:
   a power switch having a control terminal, the power switch for coupling to the cell;
   plus and minus battery pack terminals for coupling across the series-connected power switch and cell and for coupling to a charger or a load;
   a transistor having a current path coupled between the plus terminal and the power switch control terminal and having a control terminal coupled to the minus terminal; and
   a resistor coupled between the transistor control terminal and the minus terminal.

2. A circuit according to claim 1 wherein the power switch further comprises:

a power FET having a drain for coupling to the cell in series, a source and a gate; and a resistor coupled between the power FET source and gate.

3. A circuit according to claim 1 wherein the power switch further comprises:

a first and a second power FET coupled back-to-back in series at a common drain node;

a first resistor coupled between the source and gate of the first power FET; and a second resistor coupled between the source and gate of the second power FET.

4. A circuit according to claim 1 wherein the power switch further comprises:

two power FETs coupled back-to-back in series at a common source node and a common gate node, the common gate node being the control terminal; and a resistor coupled between the common source node and the common gate node.

5. A switch according to claim 4 wherein the two power FETs include:

a first N-channel MOSFET having a source terminal coupled to a first end of the resistor, a drain terminal and a gate terminal coupled to the second end of the resistor; and a second N-channel MOSFET having a source terminal coupled to the source terminal of the first N-channel MOSFET and coupled to the first end of the resistor, a drain terminal and a gate terminal coupled to the gate terminal of the first N-channel MOSFET and to the second end of the resistor.

6. A circuit according to claim 1 further comprising:

a capacitor coupled in series with the resistor between the transistor control terminal and the minus terminal.

7. A circuit according to claim 1 wherein the transistor is a first transistor, further comprising:

a second transistor having a current path coupled between the first transistor control terminal and the minus terminal.

8. A circuit according to claim 7 wherein:

the first transistor is a bipolar PNP transistor having an emitter coupled to the plus terminal, a collector coupled to the power switch control terminal and a base; and the second transistor is a bipolar NPN transistor having a collector coupled to the first transistor base, an emitter coupled to the minus terminal and a base coupled to a ground reference.

9. A circuit according to claim 7 wherein:

the first transistor is a high voltage transistor.

10. A circuit according to claim 7 further comprising:

a switch alternatively disconnecting and connecting the control terminal of the first transistor and the current path of the second transistor to the plus terminal.

11. A circuit according to claim 7 further comprising:

a diode coupled in the current path between the first transistor control terminal and the second transistor.

12. A circuit according to claim 1 wherein the circuit charges a deeply discharged battery cell of a plurality of battery cells in a battery stack.

13. A circuit according to claim 1 further comprising:

a controller having a control terminal coupled to the power switch control terminal to control the power switch.

14. A circuit according to claim 13 wherein the controller further comprises:

a high voltage bipolar junction transistor (BJT) coupled to the power switch control terminal; and a switch coupling the plus terminal to the high voltage FET.

15. A circuit according to claim 13 wherein the controller further comprises:

a high voltage FET coupled to the power switch control terminal; and a switch coupling the plus terminal to the high voltage FET.

16. A circuit according to claim 15 wherein the high voltage FET comprises:

a PMOS FET having a source coupled to the plus terminal, a drain coupled to the power switch control terminal and a gate coupled to a node between the power switch and the cell.

17. A circuit according to claim 13 wherein the power switch further comprises:

two power FETs coupled back-to-back in series at a common source node and a common gate node, the common gate node being the control terminal; and a resistor coupled between the common source node and the common gate node.

18. A circuit according to claim 17 wherein the two power FETs include:

a first N-channel MOSFET having a source terminal coupled to a first end of the resistor, a drain terminal and a gate terminal coupled to the second end of the resistor; and a second N-channel MOSFET having a source terminal coupled to the source terminal of the first N-channel MOSFET and coupled to the first end of the resistor, a drain terminal and a gate terminal coupled to the gate terminal of the first N-channel MOSFET and to the second end of the resistor.

19. A circuit according to claim 13 wherein the transistor is a first transistor, further comprising:

a second transistor having a current path coupled between the first transistor control terminal and the minus terminal.

20. A circuit according to claim 19 wherein:

the first transistor is a bipolar PNP transistor having an emitter coupled to the plus terminal, a collector coupled to the power switch control terminal and a base; and the second transistor is a bipolar NPN transistor having a collector coupled to the first transistor base, an emitter coupled to the minus terminal and a base coupled to a ground reference.

21. A circuit according to claim 19 wherein:

the first transistor is a high voltage transistor.

22. A circuit according to claim 19 further comprising:

a switch alternatively disconnecting and connecting the control terminal of the first transistor and the current path of the second transistor to the plus terminal.

23. A circuit according to claim 19 further comprising:

a diode coupled in the current path between the first transistor control terminal and the second transistor.

24. A circuit according to claim 19 wherein:

the first transistor is a bipolar PNP transistor having an emitter coupled to the plus terminal, a collector coupled to the source of the PMOS FET and a base; and the second transistor is a bipolar NPN transistor having a collector coupled to the first transistor base, an emitter coupled to the minus terminal and a base coupled to a ground reference.

25. A circuit according to claim 24 further comprising:
a switch alternatively disconnecting and connecting the control terminal of the first transistor and the current path of the second transistor to the plus terminal.

26. A circuit according to claim 25 wherein the switch is a first switch, further comprising:
a second switch alternatively disconnecting and connecting the emitter of the second transistor to the controller.

27. A circuit according to claim 13 further comprising:
a comparator having a first input terminal coupled to the control terminal of the transistor and a second input terminal coupled to the ground reference.

28. A battery pack for charging a deeply discharged battery cell comprising:
a power switch coupled to the cell and having a control terminal;
plus and minus battery pack terminals for coupling across the series-connected power switch and cell and for coupling to a charger or a load;
a transistor having a current path coupled between the plus terminal and the power switch control terminal and having a control terminal coupled to the minus terminal;
a resistor coupled between the transistor control terminal and the minus terminal; and
a controller having a control terminal coupled to the power switch control terminal.

29. A battery pack according to claim 28 wherein the battery cell is one cell of a plurality of cells connected in series.

30. A battery pack according to claim 28 wherein the battery cell is one cell of a plurality of cells connected in parallel.

31. A battery pack according to claim 28 wherein the power switch further comprises:
a power FET having a drain for coupling to the cell in series, a source and a gate; and
a resistor coupled between the power FET source and gate.

32. A battery pack according to claim 28 wherein the power switch further comprises:
a first and a second power FET coupled back-to-back in series at a common drain node;
a first resistor coupled between the source and gate of the first power FET; and
a second resistor coupled between the source and gate of the second power FET.

33. A battery pack according to claim 28 wherein the power switch further comprises:
two power FETs coupled back-to-back in series at a common source node and a common gate node, the common gate node being the control terminal; and
a resistor coupled between the common source node and the common gate node.

34. A battery pack according to claim 33 wherein the controller further comprises:
a high voltage transistor coupled to the power switch control terminal; and
a switch coupling the plus terminal to the high voltage transistor.

35. A battery pack according to claim 28 wherein the transistor is a first transistor, further comprising:
a second transistor having a current path coupled between the first transistor control terminal and the minus terminal.

36. A battery pack according to claim 35 wherein:
the first transistor is a bipolar PNP transistor having an emitter coupled to the plus terminal, a collector coupled to the power switch control terminal and a base; and
the second transistor is a bipolar NPN transistor having a collector coupled to the first transistor base, an emitter coupled to the minus terminal and a base coupled to a ground reference.

37. A battery pack according to claim 35 wherein:
the first transistor is a high voltage transistor.

38. A battery pack according to claim 35 further comprising:
a switch alternatively disconnecting and connecting the control terminal of the first transistor and the current path of the second transistor to the plus terminal.

39. A battery pack according to claim 35 further comprising:
a diode coupled in the current path between the first transistor control terminal and the second transistor.

40. A battery pack according to claim 35 wherein:
the first transistor is a bipolar PNP transistor having an emitter coupled to the plus terminal, a collector coupled to the source of the PMOS FET and a base; and
the second transistor is a bipolar NPN transistor having a collector coupled to the first transistor base, an emitter coupled to the minus terminal and a base coupled to a ground reference.

41. A battery pack according to claim 40 further comprising:
a switch alternatively disconnecting and connecting the control terminal of the first transistor and the current path of the second transistor to the plus terminal.

42. A battery pack according to claim 41 wherein the switch is a first switch, further comprising:
a second switch alternatively disconnecting and connecting the emitter of the second transistor to a gate terminal of the controller high voltage transistor.

43. A battery pack according to claim 34 wherein the high voltage transistor comprises:
a PMOS FET having a source coupled to the plus terminal, a drain coupled to the two power FETs at the common gate node and a gate coupled to a node between the power switch and the cell.

44. A battery pack according to claim 33 wherein the two power FETs include:
a first N-channel MOSFET having a source terminal coupled to a first end of the resistor, a drain terminal and a gate terminal coupled to the second end of the resistor; and
a second N-channel MOSFET having a source terminal coupled to the source terminal of the first N-channel MOSFET and coupled to the first end of the resistor, a drain terminal and a gate terminal coupled to the gate terminal of the first N-channel MOSFET and to the second end of the resistor.

45. A battery pack according to claim 28 further comprising:
a comparator having a first input terminal coupled to the control terminal and a second input terminal coupled to the ground reference.

\* \* \* \* \*